United States Patent
Schöllhorn

(10) Patent No.: US 6,446,103 B2
(45) Date of Patent: Sep. 3, 2002

(54) NONRECURSIVE DIGITAL FILTER AND METHOD FOR CALCULATING THE COEFFICIENTS OF THE FILTER

(75) Inventor: Peter Schöllhorn, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/752,923

(22) Filed: Jan. 2, 2001

Related U.S. Application Data

(63) Continuation of application No. PCT/DE99/01878, filed on Jun. 28, 1999.

(30) Foreign Application Priority Data

Jun. 30, 1998 (DE) .......................... 198 29 289

(51) Int. Cl.[7] .............................................. G06F 17/10
(52) U.S. Cl. ................................................... 708/319
(58) Field of Search ................................. 708/319, 300

(56) References Cited

U.S. PATENT DOCUMENTS

| | | | | |
|---|---|---|---|---|
| 4,933,891 A | * | 6/1990 | Schenk | 708/319 |
| 5,159,565 A | * | 10/1992 | Bune | 708/319 |
| 5,629,955 A | * | 5/1997 | McDonough | 708/319 |
| 5,717,619 A | * | 2/1998 | Spurbeck et al. | 708/319 |
| 5,886,913 A | * | 3/1999 | Marguinaud | 708/319 |

* cited by examiner

Primary Examiner—David H. Malzahn
(74) Attorney, Agent, or Firm—Laurence A. Greenberg; Werner H. Stemer; Gregory L. Mayback

(57) ABSTRACT

The nonrecursive digital filter has variable coefficients for the purpose of shifting the frequency response from one characteristic frequency fc1 to another characteristic frequency fc2. The method enables calculating the coefficients of the nonrecursive digital filter for shifting the frequency response of the filter from one characteristic frequency fc1 to another characteristic frequency fc2. The coefficients of a prototype of the filter are prescribed or calculated for a given sampling frequency, the continuous time impulse response associated with this prototype is calculated and the impulse response is sampled at the sampling frequency fa2=fa1* fc1/fc2. The new coefficients are thereby produced. The filter can then be operated with the new coefficients at the old sampling frequency. As an alternative, the new coefficients can be calculated from the coefficients of the prototype of the filter by interpolating the values of the continuous time impulse response at an interval of 1/fa2.

15 Claims, 1 Drawing Sheet

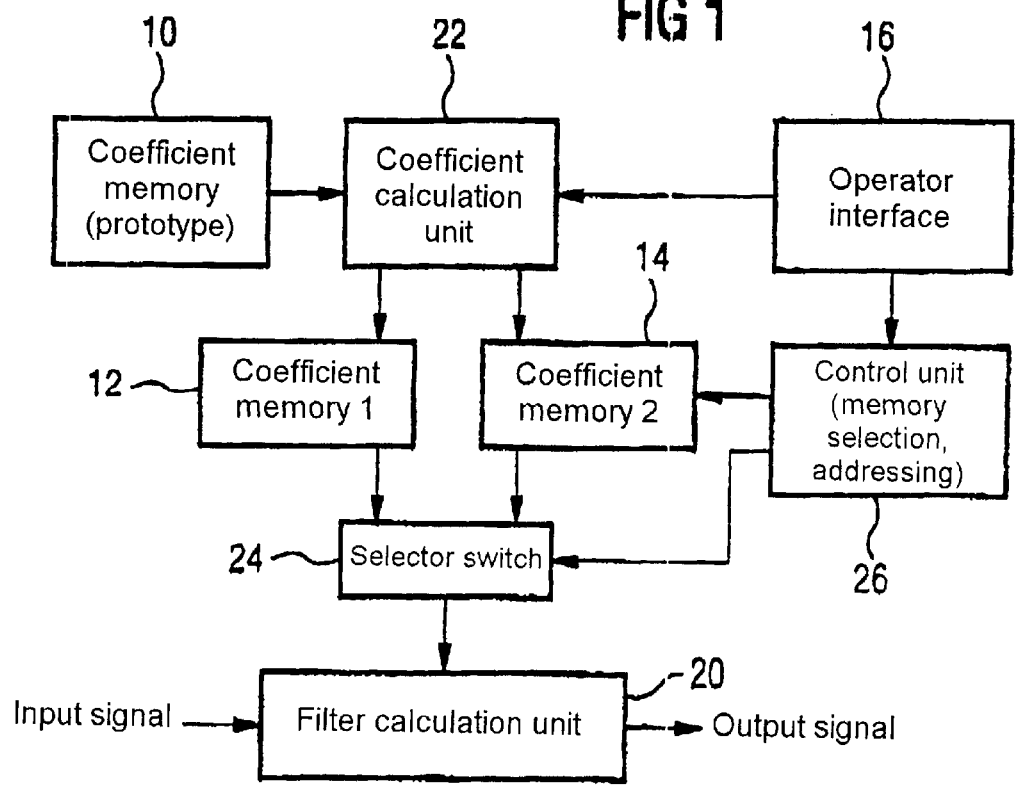
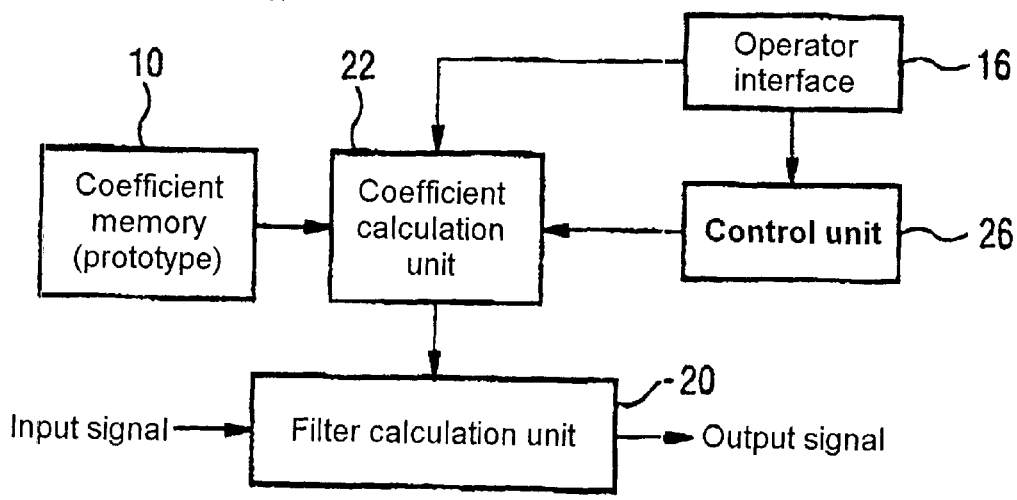

NONRECURSIVE DIGITAL FILTER AND METHOD FOR CALCULATING THE COEFFICIENTS OF THE FILTER

CROSS-REFERENCE TO RELATED APPLICATION

This is a continuation of copending international application PCT/DE99/01878, filed Jun. 28, 1999, which designated the United States.

BACKGROUND OF THE INVENTION

Field of the Invention

The present invention relates to a nonrecursive digital filter and a method for calculating the coefficients of the filter.

Numerous products contain filters (e.g. tone controls of a television set or car radio, frequency splitters of loudspeaker systems) whose characteristic must be shiftable in the frequency direction.

If these filters are realized by digital signal processing, then recursive filters are usually used despite a number of disadvantages. This filter type is characterized in that it has only few parameters (coefficients) which have to be varied in order to scale the frequency response of the filter (e.g. in order to vary the cut off frequency) without having to vary the sampling frequency of the filter.

"Zeitdiskrete Signalverarbeitung" [Discrete time signal processing] by Oppenheim and Schafer, Oldenburg Verlag, Munich, 1992, page 152 et seq. refers to the possibility of shifting the frequency response of a digital filter by varying the sampling frequency. However, this approach generally requires anti-aliassing filters or decimation filters with a variable cut-off frequency, i.e. the problem is merely shifted.

In this context, European published patent application EP 0 401 562 discloses a nonrecursive digital filter having a filter calculation unit which calculates an output signal from an input signal. The filter calculation unit is connected to a coefficient calculation unit, which supplies the coefficients for the filter calculation unit, and the coefficient calculation unit is connected to a coefficient memory, an operator interface, and a control unit.

Furthermore, the paper by Sangil Park, "REAL TIME PITCH (FREQUENCY) SHIFTING TECHNIQUES" in Proceedings of the International Conference on Consumer Electronics (ICCE), New York, USA, IEEE, Vol. Conf. 101 Jun. 1991, pages 296–97 disclosed a method for shifting the frequency/pitch of a signal in real time, in which, in the method, the signal is sampled at a second sampling rate, whose ratio with respect to the original sampling rate is chosen to correspond to the ratio of original pitch (frequency) to desired pitch (frequency), and in which the output samples are once more output at the original sampling rate.

SUMMARY OF THE INVENTION

The object of the present invention is to provide a nonrecursive digital filter which overcomes the above-noted deficiencies and disadvantages of the prior art devices and methods of this general kind, and the frequency response of which can be shifted in a simple manner at a constant sampling frequency. To that end, it is also an object of the present invention to provide the required calculation method for the coefficients of this filter.

With the above and other objects in view there is provided, in accordance with the invention, a method of calculating coefficients of a nonrecursive digital filter for shifting a frequency response of the filter from one characteristic frequency fc1 to another characteristic frequency fc2 The method comprises the following method steps: determining (i.e., prescribing or calculating) coefficients h1 (n) of a prototype of the filter for a given sampling frequency fa1;

calculating a continuous time impulse response h(t) associated with the prototype;

sampling the impulse response h(t) at a sampling frequency $$fa2 = fa1 * \frac{fc1}{fc2},$$

and thereby producing new coefficients h2 (n); and operating the filter with the new coefficient h2 (n) at fa1.

With the above and other objects in view there is also provided, in accordance with the invention, a further method of calculating the coefficients of a nonrecursive digital filter for the purpose of shifting the frequency response of this filter from one characteristic frequency fc1 to another characteristic frequency fc2 The novel method has the following method steps:

determining coefficients h1 (n) of a prototype of the filter for a given sampling frequency fa1;

calculating new coefficients h2 (n) from the coefficients h1 (n) by interpolating the values of a continuous time impulse response h(t) at an interval 1/fa2, where $$fa2 = fa1\frac{fc1}{fc2};$$

and operating the filter with the new coefficient h2 (n) at fa1.

In accordance with an added feature of the invention, polynomials are used for the interpolation. Preferably, only polynomials of order 0 to 3 are used.

In accordance with an additional feature of the invention, the continuous time filter is sampled starting from a temporal midpoint.

In accordance with another feature of the invention, the filter prototype is defined with N coefficients h1 (n), where n=0,1, . . . , N−1, and the interpolation is performed at the points $$t = \frac{N-1}{2*fa1} + \frac{k}{fa2}$$

where k=0;+/−1;+/−2, . . .

k being incremented or decremented until all the coefficients h1 (n) used for the respective interpolation have the value 0.

In accordance with a further feature of the invention, only the coefficients where k=0; +1; +2 . . . are calculated since the coefficients with negative k correspond to the corresponding coefficients with positive k.

In accordance with again an added feature of the invention, the new coefficients h2 (n) are multiplied by the samples of a sine or cosine function having a frequency fo.

It is known from systems theory (Fourier transformation) that shifting of the frequency response of a filter and opposite shifting of the impulse response of the filter correspond to one another. The coefficients of a digital nonrecursive filter (prototype of the frequency characteristic)

represent samples of such an impulse response. In principle, the continuous time profile of the impulse response can then be calculated from the samples, with a sampling frequency fa1 being prescribed. Coefficients of a nonrecursive digital filter are again obtained by sampling the continuous time signal at another sampling frequency fa2. If this filter is then operated at the sampling frequency fa1, the desired shifted frequency characteristic is obtained. If fa2 is chosen to be greater than fa1, then the frequency characteristic of the filter is compressed, and for fa2 less than fa1 the characteristic is expanded. In this case, the actual problem consists in the interpolation of the new coefficients from the coefficients of the prototype. This interpolation corresponds to the combination of reconstruction of the continuous time impulse response and sampling thereof at fa2. The realization details are explained in detail below:

Let H(f) be the Fourier transform of the impulse response h(t) of a linear system, in short: h(t)⇔H(f). The following holds true in that case: h(a*t) 1/a*H(f/a), i.e. if the impulse response h(t) is expanded (a<1), then the transform H(f) is compressed, and vice versa. In addition, the transform H(f) is "amplified" by the factor 1/a.

In principle, this property is also preserved after the sampling of the impulse response, as long as the sampling theorem is not violated. If the theorem is violated, care must be taken to ensure that the desired frequency characteristic H(f/a) is not varied impermissibly.

Assume that a digital filter is operated at the sampling frequency fa1 and then has the characteristic frequency (e.g. 3 dB—cut off frequency of a low pass filter) fc1. If the same filter is then operated at the sampling frequency fa2, the new characteristic frequency fc1=fc1*(fa2/fa1) is produced.

The calculation of the coefficients of a new nonrecursive filter from the coefficients of a prescribed nonrecursive filter (called prototype hereinafter) with the aim of shifting the characteristic frequency from fc1 to fc2 is done as follows:

Step 1: Calculate coefficients h1 (n) of the prototype for the sampling frequency fa1.

Step 2: Calculate the associated continuous time impulse response h(t)

Step 3: Sampling of the impulse response h(t) at the sampling frequency fa2=(fc1/fc2)*fa1.

Step 4: operation of the new filter with the coefficients h2 (n) at fa1.

In order to be able to use this method in practice, even under real time conditions, steps 2 and 3 are combined, i.e. the new coefficients are calculated from the coefficients of the prototype. In this case, the values of the continuous time impulse response h(t) are interpolated at an interval of 1/fa2. In practice, polynomials are suitable, inter alia, for interpolation. In principle, the degree of the polynomials is arbitrary. In practice, for reasons of complexity, only polynomials of order 0 (holding element), of order 1 (linear interpolation), of order 2 (quadratic interpolation), or of order 3 (cubic interpolation) will be expedient.

If the prototype has a constant group delay time, then this property, which is generally particularly useful, can be transferred to the new filter by sampling the continuous time filter starting from the temporal midpoint. If the prototype has N coefficients h1 (n), where n=0,1, . . . , N−1, then the temporal midpoint of h(t) lies at the height tm=(N 1)/2* 1/fa1. As a result, h(t) must be interpolated at the points t=tm+k*1/fa2 where k=0, +/−1, +/−2 etc. The variable k must be incremented or decremented until all the discrete values h1 (n) used for the respective interpolation have the value zero.

On account of the symmetry of the impulse response, in principle only half of the coefficients actually have to be calculated (k>=0).

The Fourier transform also has the following property:

$$\sin(2*\pi*f0*t)*h(t) \Leftrightarrow 1/(2i)*H(f-f0)-1/(2i)*H(f+f0)$$

or $$\cos(2*\pi*f0*t)*h(t) \Leftrightarrow 1/2*H(f-f0)1/2*H(f+f0).$$

This also applies, with the restrictions already mentioned above, to sampled signals and thus to digital filters as well, i.e. if the coefficients of the filter are multiplied by the samples of a sine or cosine function having the frequency f0, then the original frequency characteristic is shifted by f0 (e.g. a low pass filter thus becomes a bandpass filter). As a result, using simple measures, the frequency responses of digital filters can be shifted even under real time conditions. As a result, e.g. equalizers with a constant group delay time (car radio, television sets, stereo system, etc.) can be constructed from nonrecursive filters. Conventional equalizers are constructed from recursive filters having major delay distortion.

With the above and other objects in view there is also provided, in accordance with the invention, a nonrecursive digital filter, comprising:

a filter calculation unit for calculating an output signal from an input signal;

a coefficient calculation unit connected to the filter calculation unit, the coefficient calculation unit supplying coefficients for the filter calculation unit; and coefficient memory, an operator interface, and a control unit connected to the coefficient calculation unit.

In accordance with again an added feature of the invention, one or more further coefficient memories are connected between the coefficient calculation unit and the filter calculation unit.

In accordance with a concomitant feature of the invention, a plurality of coefficient memories are connected to the filter calculation unit via a selectoral switch.

Other features which are considered as characteristic for the invention are set forth in the appended claims.

Although the invention is illustrated and described herein as embodied in a nonrecursive digital filter and method for calculating the coefficients of this filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a digital filter according to the invention in which all the coefficients for the new filter characteristic are first calculated completely; and FIG. 2 is a block diagram of a filter according to the invention in which the characteristic of the filter can be changed without a time delay.

DESCRIPTION OF THE PREFERRED EMBODIMENTS

In both variants, the fixed coefficients of the prototype are stored in a memory 10 and are generally not varied during operation. If it is ensured that the coefficients will never be varied, then it is possible to use a cost effective ROM memory, which allows even very extensive sets of coefficients to be stored.

If it is possible for all the coefficients of the new filter first to be calculated completely before they are used for calculating the filter output values, then it is possible to use an interpolation polynomial with a higher degree. If the prototype has symmetrical coefficients, then only half of the coefficients actually have to be calculated and stored (see above).

Referring now to the figures of the drawing in detail and first, particularly, to FIG. 1 thereof, there is seen an embodiment of such a filter, in which the corresponding sets of coefficients are calculated and made available in advance.

Two RAM memories 12, 14 are used: one memory 12 contains the current filter coefficients, and the second memory 14 holds the recalculated coefficients if a different characteristic is required. If all the new coefficients are available, the two memories interchange their roles. If only half of the set of coefficients is calculated and stored in the case of symmetrical, linear phase filters, then this circumstance must be taken into account by the corresponding calculation of the memory address.

By way of example, tone controls and frequency splitters are considered as applications here. In this case, new coefficients have to be calculated whenever parameters are varied at the operator interface (sliding control, rotary knob). There is a great deal of time available here—compared to the sampling frequency of the filter—for calculating the new coefficients "off line."

The construction of such a filter is illustrated in detail in FIG. 1. As in all digital filters, an input signal is fed to a filter calculation unit 20, which converts the input signal into an output signal. According to the invention, however, the corresponding coefficients for the conversion are in this case not defined in the filter calculation unit, rather they are fed to the filter calculation unit from the outside. A coefficient calculation unit 22 serves for determining the corresponding coefficients. The coefficient calculation unit 22 is connected to the coefficient memory 10 (see above) for the coefficients of the filter prototype and to an operator interface 16. The coefficient calculation unit 22 feeds the calculated coefficients alternately to one of the two coefficient memories 12, 14. The latter are connected to a selector switch 24, which in each case switches through one set of coefficients from the coefficient memory 12 or the coefficient memory 14 to the filter calculation unit 20. The selector switch is controlled by means of a control unit 26, which is in turn driven by the operator interface 16.

If the intention is to use the simplest possible method of interpolation (holding element or linear interpolation), for example, in order to be able to calculate the required coefficients continuously, then the number N of coefficients of the prototype can be increased until it is ensured that the interpolated impulse response h2 (n) satisfies the requirements of the respective application. No coefficient memories are required in this case. All applications in which it is necessary for the changed characteristic of the filter to become effective immediately require this variant.

FIG. 2 shows an embodiment of the filter according to the invention in which the coefficients can be adapted in real time. In this case, it is necessary merely to use a sufficiently fast coefficient calculation unit or a correspondingly simplified algorithm for calculating the coefficients. Coefficient memories and coefficient memory selection are obviated in this case.

I claim:

1. A method of calculating coefficients of a nonrecursive digital filter for shifting a frequency response of the filter from one characteristic frequency fc1 to another characteristic frequency fc2 which comprises the following method steps:

determining coefficients h1 (n) of a prototype of the filter for a given sampling frequency fa1;

calculating a continuous time impulse response h(t) associated with the prototype;

sampling the impulse response h(t) at a sampling frequency $$fa2 = fa1 * \frac{fc1}{fc2},$$

and thereby producing new coefficients h2 (n); and operating the filter with the new coefficient h2 (n) at fa1.

2. The method according to claim 1, wherein the determining step comprises calculating the coefficients h1 (n) of the prototype of the filter for the given sampling frequency fa1.

3. The method according to claim 1, wherein the determining step comprises prescribing the coefficients h1 (n) of the prototype of the filter for the given sampling frequency fa1.

4. The method according to claim 3, which comprises sampling a continuous time filter starting from a temporal midpoint of the continuous time impulse response h(t) associated with the coefficients h1 (n).

5. The method according to claim 4, wherein the filter prototype has N coefficients h1 (n), where n=0,1, ..., N−1, and an interpolation is performed at the points $$t = \frac{N-1}{2 * fa1} + \frac{k}{fa2}$$

where k=0;+/−1;+/−2, . . .

k being incremented or decremented until all the coefficients h1 (n) used for the respective interpolation have the value 0.

6. The method according to claim 5, which comprises calculating only the coefficients where k=0; +1; +2 . . . since the coefficients with negative k correspond to the corresponding coefficients with positive k.

7. A method of calculating the coefficients of a nonrecursive digital filter for shifting a frequency response of the filter from one characteristic frequency fc1 to another characteristic frequency fc2, which comprises the following method steps:

determining coefficients h1 (n) of a prototype of the filter for a given sampling frequency fa1;

calculating values of a continuous time impulse response h(t) from the associated coefficients h1 (n) of a prototype of the filter;

calculating new coefficients h2 (n) from the coefficients h1 (n) by interpolating the values of the continuous time impulse response h(t) at an interval 1/fa2, where $$fa2 = fa1\frac{fc1}{fc2};$$

and operating the filter with the new coefficient h2 (n) at fa1.

8. The method according to claim 7, wherein the determining step comprises prescribing the coefficients h1 (n) of the prototype of the filter for the given sampling frequency fa1.

9. The method according to claim 7, wherein the determining step comprises calculating the coefficients h1 (n) of the prototype of the filter for the given sampling frequency fa1.

10. The method according to claim 7, which comprises using polynomials for the interpolation.

11. The method according to claim 10, which comprises using only polynomials of order 0 to 3.

12. The method according to claim 7, which comprises multiplying the new coefficients h2 (n) by the samples of a sine or cosine function having a frequency fo.

13. A nonrecursive digital filter, comprising:
 a filter calculation unit for calculating an output signal from an input signal;
 a coefficient calculation unit connected to said filter calculation unit, said coefficient calculation unit supplying coefficients for said filter calculation unit; and
 a coefficient memory, an operator interface, and a control unit connected to said coefficient calculation unit.

14. The filter according to claim 13, which comprises at least one further coefficient memory connected between said coefficient calculation unit and said filter calculation unit.

15. The filter according to claim 14, which comprises a plurality of coefficient memories connected to said filter calculation unit via a selectoral switch.

* * * * *